United States Patent [19]

Iwasa et al.

[11] Patent Number: 5,569,947
[45] Date of Patent: Oct. 29, 1996

[54] INSULATED-GATE FIELD-EFFECT TRANSISTOR IN A SEMICONDUCTOR DEVICE IN WHICH SOURCE/DRAIN ELECTRODES ARE DEFINED BY FORMATION OF SILICIDE ON A GATE ELECTRODE AND A FIELD-EFFECT TRANSISTOR

[75] Inventors: Shoichi Iwasa; Takeshi Naganuma, both of Tokyo, Japan

[73] Assignee: Nippon Steel Corporation, Tokyo, Japan

[21] Appl. No.: 496,064

[22] Filed: Jun. 28, 1995

[30] Foreign Application Priority Data

Jun. 28, 1994 [JP] Japan ..................................... 6-168998

[51] Int. Cl.$^6$ ................................................. H01L 27/088
[52] U.S. Cl. .......................... 257/336; 257/344; 257/408; 257/412; 257/413; 257/900; 257/382; 257/383; 257/384
[58] Field of Search ..................................... 257/412, 413, 257/408, 344, 336, 900, 374, 382, 383, 384, 377, 397

[56] References Cited

U.S. PATENT DOCUMENTS 4,212,100  7/1980  Paivinen et al. ..................... 257/412 X
5,023,679  6/1991  Shibata ................................. 257/412 X
5,097,301  3/1992  Sanchez ............................... 257/412 X
5,276,347  1/1994  Wei et al. ............................ 257/412 X

FOREIGN PATENT DOCUMENTS 61-139067  6/1986  Japan ..................................... 257/413
   81051  12/1987  Japan .

*Primary Examiner*—William Mintel
*Attorney, Agent, or Firm*—Pollock, Vande Sande & Priddy

[57] ABSTRACT

For manufacturing an insulated-gate field-effect transistor in a semiconductor device, a refractory metal film is formed on a semiconductor substrate with an insulating film being interposed therebetween. An insulated gate electrode is formed by patterning the refractory metal film and insulating film. After formation of source/drain regions in a surface of the substrate, using the insulated gate electrode as a mask, a poly-silicon film is formed to cover the surface portion of the substrate and the patterned refractory metal film of the gate electrode. The resulting structure is heated to convert at least that portion of the poly-silicon film which lies on the patterned refractory metal film to a silicide film portion. The thus formed silicide film portion is removed so that portions of the doped poly-silicon film are left on the source/drain regions in the surface of semiconductor substrate. These portions of the doped poly-silicon film serve as source/drain electrodes.

16 Claims, 1 Drawing Sheet

INSULATED-GATE FIELD-EFFECT TRANSISTOR IN A SEMICONDUCTOR DEVICE IN WHICH SOURCE/DRAIN ELECTRODES ARE DEFINED BY FORMATION OF SILICIDE ON A GATE ELECTRODE AND A FIELD-EFFECT TRANSISTOR

FIELD OF THE INVENTION

The present invention relates to a semiconductor device and a method of manufacturing thereof, and more particularly to a method of manufacturing of a semiconductor device suitable for increasing the integration density of the electrode portions and miniaturizing device regions.

BACKGROUND OF THE INVENTION

The rapidity at which the device integration density has progressed in recent years in semiconductor IC devices is remarkable, and the pattern line width has been reduced to the order of sub-microns. Consequently, the required high accuracy of mask alignment in photolithography for the manufacturing of semiconductor devices impedes further miniaturization of semiconductor devices.

The source/drain regions of a MOS transistor have been difficult to miniaturize. The reason for this is that the accuracy of mask alignment at the time of formation of the electrodes of the source/drain regions, which governs the occupation areas of the regions, could not be attained to the required degree. It has heretofore been difficult to miniaturize the device occupation areas.

There have been proposed methods for realizing a high integration density for the electrode portions by forming the electrode portions in a self-aligned fashion. An example is the method disclosed in JP-B-5-81051 (published on Nov. 11, 1993) corresponding to JP-A-62-291176 (laid-open on Dec. 17, 1987).

The problem with the conventional manufacturing method is that it requires many manufacturing steps to form electrodes of diffused layers (source/drain regions), including the steps of (a) depositing a molybdenum film on a poly-silicon film, (b) causing an impurity in a poly-silicon film to diffuse into the poly-silicon to form an impurity-doped poly-silicon film, and (c) a heat treatment for making the molybdenum film react with the impurity-doped poly-silicon film. This, however, tends to decrease the throughput and production yield.

SUMMARY OF THE INVENTION

An object of the present invention is to provide a method of manufacturing a semiconductor device in which electrodes of sources/drains of an insulated-gate field-effect transistor (IG FET) can be miniaturized with a relatively small number of manufacturing steps.

Another object of the present invention is to provide a method of manufacturing an insulated-gate FET in a semiconductor IC device.

Another object of the present invention is to provide an insulated-gate FET in a semiconductor IC device, in which the semiconductor IC device can be manufactured with a relatively small number of manufacturing steps.

According to one aspect of the present invention, for manufacturing an insulated-gate field-effect transistor in a semiconductor device, a refractory metal film is formed over a semiconductor substrate with an insulating film interposed therebetween. An insulated gate electrode is formed by patterning the refractory metal film and the insulating film. After formation of source/drain regions in a surface portion of the substrate using the patterned refractory metal film of the gate electrode and the patterned insulating film as a mask, a poly-silicon film is formed extending to cover the surface potion of the substrate and the patterned refractory metal film of the gate electrode. The resulting structure is heated to change that portion of the poly-silicon film which lies on the patterned refractory metal film to a silicide film portion and to cause out-diffusion of an impurity in the source/drain regions to the poly-silicon film. The thus formed silicide film portion is removed so that portions of the poly-silicon film are left on the source/drain regions in the surface portion of the semiconductor substrate. The remaining portions of the doped poly-silicon film serve as the source/drain electrodes.

According to another aspect of the present invention, the semiconductor device manufacturing method comprises a step of (a) forming a conductive film made of a refractory metal at least on one principal surface of a semiconductor substrate, (b) forming an electrode by patterning the conductive film, (c) forming side wall insulating films on side walls of the electrode, (d) forming a poly-silicon film in such a way as to cover the surfaces of the substrate, electrode and side wall insulating films, (e) converting the above-mentioned poly-silicon film on the refractory metal film to silicide by a heat treatment, and (f) selectively removing the silicide film portion.

DESCRIPTION OF THE PREFERRED EMBODIMENTS OF THE INVENTION

With reference to FIGS. 1a to 1g, description will be made of the method of manufacturing a semiconductor according to an embodiment of the present invention.

FIGS. 1a to 1g are schematic sectional diagrams illustrating a sequence of steps of the method of manufacturing an insulated-gate FET in a semiconductor device according to an embodiment of the present invention. In this embodiment, the insulated-gate FET is a MOS transistor.

Figure 1A:
FIGS. 1a to 1g are schematic sectional diagrams of a sequence of steps of the method of manufacturing an insulated-gate FET according to an embodiment of the present invention.

As shown in FIG. 1a, a field oxide film 12 is formed in device isolation regions of a p-type silicon substrate 11 by the LOCOS process.

Figure 1B:
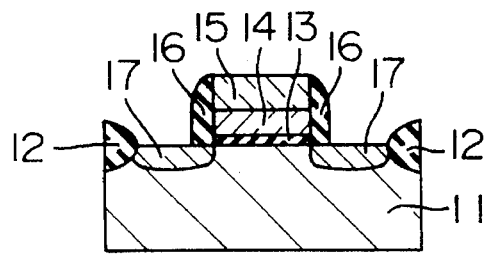

Then, as shown in FIG. 1b, a silicon oxide film 13 is formed to a thickness of 150 to 200 Å by thermal oxidation at 1000° to 1100° C. A poly-silicon film 14 is deposited to a thickness of 1500 to 2000 Å by CVD at 600° to 650° C., and impurity ions such as phosphorus ions are introduced into the poly-silicon film 14. After this, a refractory metal film 15 is deposited to a thickness of, for example, 1500 to 2000 Å on the poly-silicon film 14 by sputtering, for example, and then the poly-silicon film 14 and the refractory metal film 15 are patterned into a gate electrode. The refractory metal film, may be made of a transition metal, preferably, having a melting point not lower than about 1000° C. Thus, titanium, tantalum, molybdenum, tungsten, etc. which are capable of withstanding a high temperature heat treatment may be used. Note that titanium, tantalum, molybdenum, tungsten, etc. can be etched by sulphuric acid.

Then, by using the poly-silicon film 14 and the refractory metal film 15 as a mask, phosphorus or arsenic ions are implanted to form a low impurity concentration n-type diffused layer 17 in a self-aligned manner, and a silicon oxide film, not shown, is deposited on the entire surface including the substrate 11, the refractory metal film 15, the side surfaces of the poly-silicon film 14 and the poly-silicon film 14. The silicon oxide film is etched back by the RIE to form a side wall insulating film 16 on side walls of the poly-silicon film 14 and on the refractory metal film 15. In this embodiment, the side wall insulating film 16 is formed of a silicon oxide film, but it may be formed of a silicon nitride film.

Figure 1C:
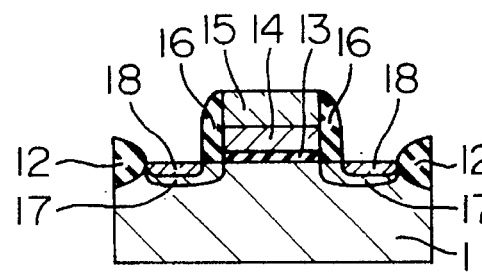

Subsequently, as shown in FIG. 1c, high impurity concentration n-type diffused layers 18 are formed in a self-aligned manner by implanting ions of phosphorus or arsenic while using the poly-silicon film 14, the refractory metal film 15 and the side walls of those films as a mask.

Figure 1D:
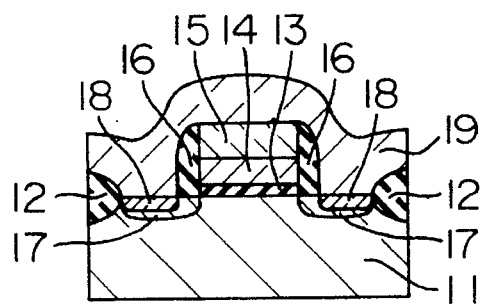

Then, as shown in FIG. 1d, a poly-silicon film 19 is deposited over the entire wafer to a thickness of 1500 to 2000 Å by CVD or the like.

Figure 1E:
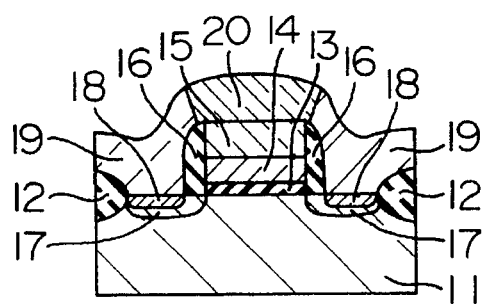

Next, as shown in FIG. 1e, the wafer is heat-treated at 900° C. in a nitrogen atmosphere for about 10 to 20 min., preferably 15 to 20 min., so that the refractory metal film 15 is made to react with the overlying poly-silicon film 19 to form a silicide film 20. By this heat treatment, the impurity in the high impurity concentration layers 18 is diffused out of the poly-silicon film 19 so that portions of the film 19 lying on the layers 18 are doped with the impurity and are made conductive. In addition, by this heat treatment, the poly-silicon film 14 is also converted into a silicide film.

Figure 1F:
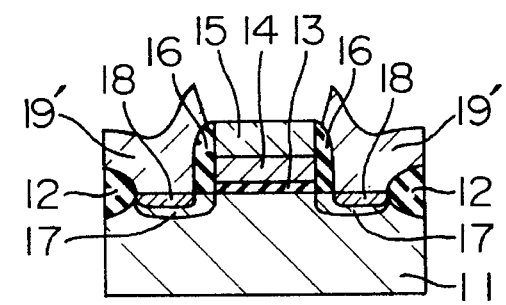

Thereafter, as shown in FIG. 1f, the silicide film 20 is removed, thus forming electrodes 19' for the layers 18 (17). At this time, the removal of the silicide film 20 should not cause contact between the thus formed electrodes 19' and the refractory metal 15. Since the heat treatment in this embodiment is effected for about 10 to 20 min. as described above, the conversion of poly-silicon of the poly-silicon film 19 to silicide is effected not only at the portion of the film 19 lying on the patterned refractory metal film 15, but also at portions of the film 19 lying on parts of the upper surface of the side wall insulating film 16, so that the peripheral edge of the resulting silicide film 20 lies on the upper surface of the side wall insulating film 16, as shown in FIG. 1e. Thus, end portions of the electrodes 19' formed by the removal of the silicide film 20 lie on different parts of the upper surface of the side wall insulating film 16, which will necessarily cause the side wall insulating film 16 to be interposed between the resulting electrodes 19' and the patterned refractory metal film 15 to prevent undesirable contact therebetween.

Figure 1G:
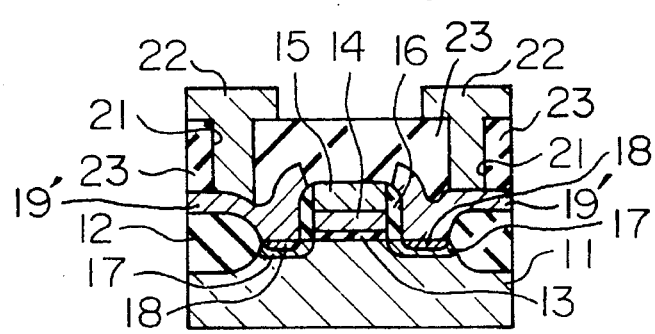

Finally, as shown in FIG. 1g, after formation of an inter-layer film 23 over the entire surface of the substrate surface, contact holes 21 for electrical connection of the MOS transistor to other devices are formed at portions of the film 23 corresponding to the electrodes 19'. A metal film 22 of, for example, Al formed on the inter-layer film 23 and in the contact holes 21 is patterned to provide a metal wiring conductor pattern 22 for electrical connection of the electrodes to the other devices.

It should be noted that in the etching of the silicide film 20, a solution whose main ingredient is sulphuric acid is used, for which reason only the silicide film 20 can be removed, with the poly-silicon films as the electrodes 19' and the refractory metal film 15 as the gate electrode remaining intact. By controlling the conditions such as etching temperature and time, the side wall insulating film 16 can be prevented from being etched.

In the above embodiment, the description has been directed to an embodiment of the invention where the electrodes of the source/drain regions are formed on an n-channel MOS transistor, but this invention can also be applied to a p-channel MOS transistor, and also can be applied to forming a polycrystalline pad layer in the field-shield isolation process.

With regard to the gate electrode, there has been described an embodiment where the gate electrode is formed in a two-layer structure of the poly-silicon film 14 and the refractory metal film 15, but the poly-silicon film 14 may be omitted.

As is clear from the above description, in the manufacturing method of this embodiment, electrodes can be formed in a self-aligned manner on the source/drain regions of a MOS transistor, so that the areas of the source/drain regions can be miniaturized to permit high device integration density, and also greatly reduce parasitic capacitances and parasitic resistances, thus making it possible to produce higher-speed semiconductor devices.

According to the above embodiment, patterning the poly-silicon films 19 as the lead-out electrodes is performed by utilizing the reaction between the poly-silicon 19 and the refractory metal film 15 formed on the gate electrode and, therefore, the manufacturing sequence can be made simpler than in the prior art.

We claim:

1. An insulated-gate field-effect transistor in a semiconductor device, comprising:
   source/drain doped regions formed in a surface portion of a semiconductor substrate;
   a gate electrode formed over said semiconductor substrate between said source/drain doped regions with an insulating film interposed between said gate electrode and said substrate, said gate electrode including a refractory metal film and a silicide film between said refractory metal film and said insulating film; and
   source/drain electrodes formed on said source/drain doped regions.

2. An insulated-gate field-effect transistor according to claim 1, further comprising a side wall insulating film formed between said source/drain electrodes and side surfaces of said gate electrode and of said insulating film.

3. An insulated-gate field-effect transistor according to claim 1, wherein said refractory film is made of a material selected from the group consisting of titanium, tantalum, molybdenum and tungsten.

4. An insulated-gate field-effect transistor according to claim 2, wherein said side wall insulating film is made of silicon oxide.

5. An insulated-gate field-effect transistor according to claim 2, wherein each of said source/drain doped regions is a double-doped region formed in a self-aligned manner with respect to said side wall insulating film.

6. An insulated-gate field-effect transistor in a semiconductor device, comprising:
   source/drain doped regions formed in a surface portion of a semiconductor substrate;
   a gate electrode formed on said semiconductor substrate between said source/drain doped regions with an insulating film interposed between said gate electrode and said substrate, said gate electrode including a refractory metal film and a silicide film between said refractory metal film and said insulating film;
   source/drain electrodes formed on said source/drain doped regions; and a side wall insulating film formed between said source/drain electrodes and side surfaces of said gate electrode and said insulating film for providing isolation between said gate electrode and said source/drain electrodes, said source/drain doped regions including double-doped regions formed in a self-aligned manner with respect to said side wall insulating film.

7. An insulated-gate field-effect transistor according to claim 6, wherein said refractory film is made of a material selected from the group consisting of titanium, tantalum, molybdenum and tungsten.

8. An insulated-gate field-effect transistor according to claim 6, wherein said side wall insulating film is made of silicon oxide.

9. An insulated-gate field-effect transistor in a semiconductor device comprising:

source/drain doped regions formed in a surface portion of a semiconductor substrate; and a gate electrode formed over said semiconductor substrate between said source/drain doped regions with an insulating film interposed between said gate electrode and said substrate, said gate electrode including a refractory metal film and a silicide film between said refractory metal film and said insulating film.

10. An insulated-gate field-effect transistor according to claim 9, further comprising a side wall insulating film formed on side surfaces of said gate electrode and of said insulating film.

11. An insulated-gate field-effect transistor according to claim 9, wherein said refractory film is made of a material selected from the group consisting of titanium, tantalum, molybdenum and tungsten.

12. An insulated-gate field-effect transistor according to claim 9, wherein said side wall insulating film is made of silicon oxide.

13. An insulated-gate field-effect transistor according to claim 9, wherein each of said source/drain doped regions is a double-doped region formed in a self-aligned manner with respect to said side wall insulating film.

14. An insulated-gate field-effect transistor according to claim 2, wherein said side wall insulating film is made of silicon nitride.

15. An insulated-gate field-effect transistor according to claim 6, wherein said side wall insulating film is made of silicon nitride.

16. An insulated-gate field-effect transistor according to claim 9, wherein said side wall insulating film is made of silicon nitride.

* * * * *